United States Patent
Li et al.

(10) Patent No.: US 12,520,605 B2
(45) Date of Patent: Jan. 6, 2026

(54) MOLYBDENUM DISELENIDE (MoSe2)/InGaN MULTISPECTRAL PHOTOELECTRIC DETECTOR AND PREPARATION METHOD AND USE THEREOF

(71) Applicant: SOUTH CHINA UNIVERSITY OF TECHNOLOGY, Guangzhou (CN)

(72) Inventors: Guoqiang Li, Guangzhou (CN); Deqi Kong, Guangzhou (CN); Wenliang Wang, Guangzhou (CN); Liang Chen, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 383 days.

(21) Appl. No.: 18/276,662

(22) PCT Filed: Dec. 30, 2021

(86) PCT No.: PCT/CN2021/143373
§ 371 (c)(1),
(2) Date: Aug. 10, 2023

(87) PCT Pub. No.: WO2023/045171
PCT Pub. Date: Mar. 30, 2023

(65) Prior Publication Data
US 2024/0313143 A1   Sep. 19, 2024

(30) Foreign Application Priority Data
Sep. 26, 2021 (CN) .......................... 202111132346.3

(51) Int. Cl.
*H10F 30/21* (2025.01)
*H10F 30/222* (2025.01)
(Continued)

(52) U.S. Cl.
CPC .......... *H10F 30/288* (2025.01); *H10F 30/222* (2025.01); *H10F 71/00* (2025.01); *H10F 77/148* (2025.01); *H10F 77/206* (2025.01)

(58) Field of Classification Search
CPC ...... H10F 30/288; H10F 30/222; H10F 71/00; H10F 71/1274; H10F 77/148;
(Continued)

(56) References Cited

U.S. PATENT DOCUMENTS

2022/0120619 A1*  4/2022  Valouch ................ H10F 39/103

FOREIGN PATENT DOCUMENTS

CN     105405915 A      3/2016
CN     106129166 A  *  11/2016  ............. H10F 71/00
(Continued)

OTHER PUBLICATIONS

Wang et al. "High-performance MoSe2 homojunction infrared photodetector", Infrared Physics & Technology, vol. 106, 2020, 103272, ISSN 1350-4495, https://doi.org/10.1016/j.infrared.2020.103272 (Year: 2020).*

(Continued)

*Primary Examiner* — Sitaramarao S Yechuri
(74) *Attorney, Agent, or Firm* — Bayramoglu Law Offices LLC

(57) ABSTRACT

A molybdenum diselenide ($MoSe_2$)/InGaN multispectral photoelectric detector includes a substrate, a buffer layer, an InGaN layer and a $MoSe_2$ layer that are arranged sequentially from bottom to top. The $MoSe_2$ layer partially covers the InGaN layer. The photoelectric detector further includes a barrier layer and an electrode layer. The barrier layer is provided on the InGaN layer not covered by the $MoSe_2$ layer and on a part of the $MoSe_2$ layer. The electrode layer is provided on the barrier layer and covers a part of an exposed portion of the $MoSe_2$ layer. A preparation method of the
(Continued)

detector is further provided. The detector detects red light and blue light at the same time. While realizing a sensitivity enhanced micro-nano structure on a surface of a detector chip, the detector improves quantum efficiency in blue and red bands, and enhances resonant absorption for the blue light and red light.

20 Claims, 2 Drawing Sheets

(51) Int. Cl.
*H10F 71/00* (2025.01)
*H10F 77/14* (2025.01)
*H10F 77/20* (2025.01)

(58) Field of Classification Search
CPC .. H10F 77/206; H10F 77/12485; H10F 77/30; Y02P 70/50
See application file for complete search history.

(56) References Cited

FOREIGN PATENT DOCUMENTS

| CN | 107749433 | A | * | 3/2018 | ............. H10F 71/00 |
| CN | 108695436 | A | | 10/2018 | |
| CN | 109037450 | A | * | 12/2018 | ............. H10K 85/30 |
| CN | 110444626 | A | | 11/2019 | |
| CN | 110581197 | A | * | 12/2019 | ......... H10F 71/1272 |
| CN | 110690313 | A | | 1/2020 | |
| CN | 112186052 | A | * | 1/2021 | ......... H10F 71/1278 |
| CN | 116469954 | A | * | 7/2023 | ............. H10F 71/00 |

OTHER PUBLICATIONS

Xie et al., "InP-Based Near Infrared/Extended-Short Wave Infrared Dual-Band Photodetector," in IEEE Photonics Technology Letters, vol. 32, No. 16, pp. 1003-1006, Aug. 15, 15, 2020, doi: 10.1109/LPT.2020.3008853 (Year: 2020).*

* cited by examiner

MOLYBDENUM DISELENIDE (MoSe2)/InGaN MULTISPECTRAL PHOTOELECTRIC DETECTOR AND PREPARATION METHOD AND USE THEREOF

CROSS REFERENCE TO THE RELATED APPLICATIONS

This application is the national phase entry of International Application No. PCT/CN2021/143373, filed on Dec. 30, 2021, which is based upon and claims priority to Chinese Patent Application No. 202111132346.3, filed on Sep. 26, 2021, the entire contents of which are incorporated herein by reference.

TECHNICAL FIELD

The present disclosure relates to the field of visible light detectors, and in particular, to a molybdenum diselenide (MoSe$_2$)/InGaN multispectral photoelectric detector and a preparation method and use thereof.

BACKGROUND

III-nitride photoelectric devices and power devices have received widespread attention and focused research due to the desirable optical, electrical, thermal, chemical and mechanical properties of III-nitride semiconductor materials.

As a research hotspot in third-generation semiconductor materials, the InGaN material has good physicochemical properties. With high electronic mobility, good thermostability and excellent chemical stability of the InGaN material, the band gap of the InGaN material can be continuously adjusted from 3.4 eV to 0.7 eV by adjusting the In component of the alloy. Thus, the InGaN detector can realize continuous detection in the whole visible light band. Compared with a photomultiplier tube, the InGaN detector has the advantages of small size, portability, easy integration, high breakdown field (>1 MV/cm), low working voltage, energy saving, environmental protection, and no filter system.

In spite of certain progress made in research, the InGaN detector hasn't been put into commercial use. Material quality is a matter of concern in restricting development and application of the InGaN detector. For serious lattice mismatch (>16.9%) between the InGaN detector and the Si substrate, the InGaN epitaxial layer is prone to a high density of dislocations. On the other hand, the InGaN material is phase-separated, particularly for the high content of the In component. In response to InGaN growth of the GaN material, and due to lattice mismatch between InGaN and GaN, as thickness increases, a relaxation is presented to produce defects. These defects can serve as captured carriers. Consequently, the carrier transport property is reduced, and the InGaN detector has a lower quantum efficiency to affect its response speed, and sensitivity.

SUMMARY

An objective of the present disclosure is to provide a MoSe$_2$/InGaN multispectral photoelectric detector and a preparation method thereof, to solve the above-mentioned problem. The MoSe$_2$/InGaN multispectral photoelectric detector provided by the present disclosure has the following advantages: Through an AlN/AlGaN/GaN buffer layer, the present disclosure reduces dislocations and releases stresses, such that the defect density is reduced from $10^8$ to $10^5$, and the grown InGaN material has better quality. By growing a high-quality two-dimensional (2D) MoSe$_2$ material on the InGaN, a single-layer MoSe$_2$ structure with a thickness of 1 nm is grown. With the MoSe$_2$/InGaN functional layer, the detector realizes blue and red multispectral photoelectric detection. Meanwhile, the 2D MoSe$_2$ has desirable conductivity and light transmission. Compared with a conventional InGaN photoelectric detector, the MoSe$_2$/InGaN structure has higher carrier injection efficiency in the blue band to accelerate response of the InGaN blue light detector.

Another objective of the present disclosure is to provide use of the MoSe$_2$/InGaN multispectral photoelectric detector. The MoSe$_2$/InGaN multispectral photoelectric detector is used in blue and/or red multispectral photoelectric detection.

The objective of the present disclosure is achieved by the following technical solutions:

A MoSe$_2$/InGaN multispectral photoelectric detector includes a substrate, a buffer layer, an InGaN layer and a MoSe$_2$ layer that are arranged sequentially from bottom to top, where the MoSe$_2$ layer partially covers the InGaN layer; and the photoelectric detector further includes a barrier layer and an electrode layer; the barrier layer is provided on the InGaN layer not covered by the MoSe$_2$ layer and on a part of the MoSe$_2$ layer; and the electrode layer is provided on the barrier layer and covers a part of an exposed portion of the MoSe$_2$ layer.

The InGaN layer and the MoSe$_2$ layer form a MoSe$_2$/InGaN functional layer.

That the MoSe$_2$ layer partially covers the InGaN layer specifically indicates that the MoSe$_2$ layer forms stepwise horizontal stages on the InGaN layer. The barrier layer is provided on the InGaN layer not covered by the MoSe$_2$ layer and on a part of the MoSe$_2$ layer, and specifically the barrier layer is provided on the stepwise horizontal stages on the InGaN layer and on the part of the MoSe$_2$ layer.

The barrier layer is an Al$_2$O$_3$ barrier layer.

The buffer layer includes an AlN layer, an AlGaN layer and a GaN layer that are arranged sequentially from bottom to top; the AlN layer is provided on the substrate; and the InGaN layer is provided on the GaN layer.

The InGaN layer has a thickness of 100 nm to 200 nm, and the MoSe$_2$ layer has a thickness of 1 nm to 2 nm.

The substrate is a Si substrate.

The AlN layer, the AlGaN layer and the GaN layer respectively have a thickness of 350 nm to 450 nm, a thickness of 650 nm to 700 nm, and a thickness of 4 μm to 5 μm.

The MoSe$_2$ layer is located at a middle of an upper surface of the InGaN layer, and specifically two ends of the MoSe$_2$ layer respectively form the stepwise horizontal stages on the InGaN layer.

The barrier layer is separately provided on the two stepwise horizontal stages and neighboring parts of the MoSe$_2$ layer. The electrode layer is separately provided on the two barrier layers and a part of the MoSe$_2$ layer.

The electrode layer is shaped as an interdigital electrode.

The electrode layer is a metal electrode layer, and is specifically a Ti/Au metal layer. The Ti/Au metal layer includes a Ti metal layer and an Au metal layer that are arranged from bottom to top. The Ti layer is adjacent to the barrier layer. The Ti metal layer has a thickness of 20 nm to 30 nm, and the Au metal layer has a thickness of 100 nm to 110 nm.

The preparation method of the MoSe$_2$/InGaN multispectral photoelectric detector includes the following steps:

(1) growing the buffer layer on the substrate by metal organic chemical vapor deposition (MOCVD), and sequentially growing the InGaN layer and the MoSe$_2$ layer on the buffer layer by MOCVD;

(2) etching the MoSe$_2$ layer, such that the MoSe$_2$ layer forms the stepwise horizontal stages on the InGaN layer; performing photoetching (including surface spin-coating, drying, exposure, development and oxygen plasma treatment) on the stepwise horizontal stages on the InGaN layer and the MoSe$_2$ layer to obtain regions for evaporating the barrier layer, and preparing the Al$_2$O$_3$ barrier layer by evaporation; and (3) performing photoetching on each of the Al$_2$O$_3$ barrier layer (performing surface spin-coating, drying, exposure, development and oxygen plasma treatment on the Al$_2$O$_3$ barrier layer) to obtain a region for evaporating a metal electrode; and evaporating the metal electrode on the Al$_2$O$_3$ barrier layer.

The AlN layer, the AlGaN layer and the GaN layer are sequentially and epitaxially grown on the substrate by MOCVD from bottom to top at a temperature of 1,100° C. to 1,200° C., a temperature of 1,100° C. to 1,200° C. and a temperature of 1,000° C. to 1,150° C. N$_2$ gas has a flow of 30 sccm to 40 sccm.

The MoSe$_2$/InGaN layer is grown on the buffer layer by MOCVD at a temperature of 600° C. to 750° C.

The photoetching is implemented under drying time of 40 s to 50 s, exposure time of 5 s to 10 s, development time of 40 s to 50 s, and oxygen plasma treatment time of 2 min to 3 min.

The Al$_2$O$_3$ barrier layer and the metal electrode layer each have an evaporation rate of 0.23 nm/min to 0.28 nm/min.

The MoSe$_2$/InGaN multispectral photoelectric detector is used in blue and/or red multispectral photoelectric detection.

Compared with the prior art, the present disclosure has the following beneficial effects and advantages:

(1) The present disclosure grows the AlN/AlGaN/GaN buffer layer on the substrate by an MOCVD high-temperature epitaxial method, grows the MoSe$_2$/InGaN functional layer on the buffer layer by an MOCVD low-temperature epitaxial method, and prepares the Al$_2$O$_3$ barrier layer and the Ti/Au electrode on the MoSe$_2$/InGaN functional layer from bottom to top by photoetching and evaporation, thereby achieving the MoSe$_2$/InGaN multispectral photoelectric detector. The preparation method provided by the present disclosure has characteristics of the simple process, time saving, high efficiency and low energy consumption, and is beneficial for scale production.

(2) The MoSe$_2$/InGaN multispectral photoelectric detector provided by the present disclosure realizes the blue and red multispectral photoelectric detection through the MoSe$_2$/InGaN functional layer. Upon that, the present disclosure optimizes the detector and the array structure to effectively accelerate a response speed.

(3) With a 2D MoSe$_2$ layer, the MoSe$_2$/InGaN structure in the blue band has a higher carrier injection efficiency. Therefore, the MoSe$_2$/InGaN multispectral photoelectric detector provided by the present disclosure improves the quantum efficiency in the blue band, and realizes high-sensitivity and high-bandwidth detection.

DETAILED DESCRIPTION OF THE EMBODIMENTS

The present disclosure is further described below with reference to the embodiments, but the implementations of the present disclosure are not limited thereto.

Figure 1:
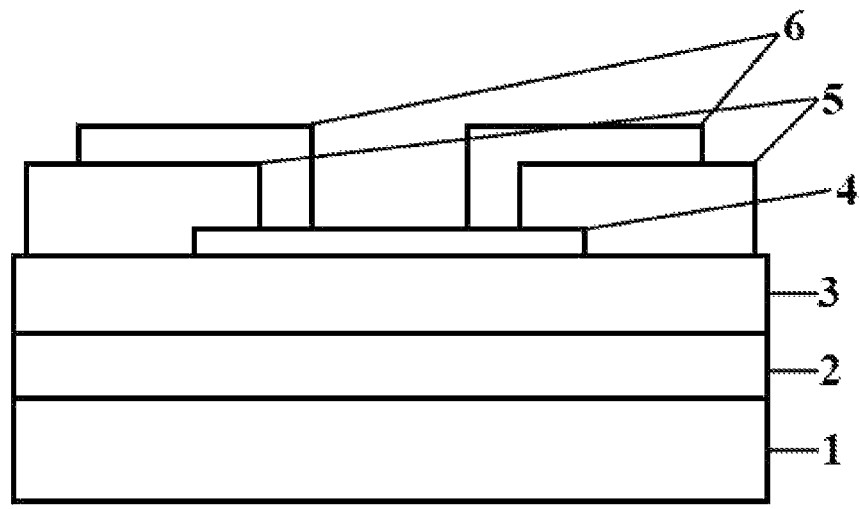
FIG. 1 is a schematic cross-sectional view of a MoSe$_2$/InGaN multispectral photoelectric detector according to the present disclosure, where, 1—substrate, 2—buffer layer, 3—InGaN layer, 4—MoSe$_2$ layer, 5—Al$_2$O$_3$ barrier layer, and 6—metal electrode layer.

With a schematic cross-sectional view as shown in FIG. 1, a MoSe$_2$/InGaN multispectral photoelectric detector provided by the present disclosure includes substrate 1, buffer layer 2, InGaN layer 3, and MoSe$_2$ layer 4 that are arranged sequentially from bottom to top. The MoSe$_2$ layer forms stepwise horizontal stages on the InGaN layer.

The photoelectric detector further includes barrier layer 5 and electrode layer 6. The barrier layer 5 is provided on the stepwise horizontal stages on the InGaN layer and a part of the MoSe$_2$ layer. The electrode layer 6 is provided on the barrier layer 5 and covers a part of an exposed portion of the MoSe$_2$ layer 4.

The InGaN layer and the MoSe$_2$ layer form a MoSe$_2$/InGaN functional layer.

The barrier layer 5 is an Al$_2$O$_3$ barrier layer.

The buffer layer 2 includes an AlN layer, an AlGaN layer and a GaN layer that are arranged sequentially from bottom to top. The AlN layer is provided on the substrate 1. The InGaN layer 3 is provided on the GaN layer.

The InGaN layer has a thickness of 100 nm to 200 nm, and the MoSe$_2$ layer has a thickness of 1 nm to 2 nm.

The substrate is a Si substrate.

The AlN layer, the AlGaN layer and the GaN layer respectively have a thickness of 350 nm to 450 nm, a thickness of 650 nm to 700 nm, and a thickness of 4 μm to 5 μm.

Two ends of the MoSe$_2$ layer 4 respectively form the stepwise horizontal stages on the InGaN layer 3 (namely the MoSe$_2$ layer 4 is provided at a middle of the InGaN layer 3).

Embodiment 1

The embodiment provides a MoSe$_2$/InGaN multispectral photoelectric detector, including a substrate, a buffer layer, an InGaN layer and a MoSe$_2$ layer that are arranged sequentially from bottom to top. The MoSe$_2$ layer forms stepwise horizontal stages on the InGaN layer. The photoelectric detector further includes a barrier layer and an electrode layer. The barrier layer is provided on the stepwise horizontal stages on the InGaN layer and a part of the MoSe$_2$ layer. The electrode layer is provided on the barrier layer and covers a part of an exposed portion of the MoSe$_2$ layer. Two ends of the MoSe$_2$ layer respectively form the stepwise horizontal stages on the InGaN layer (namely the MoSe$_2$ layer is provided at a middle of the InGaN layer). The barrier layer is provided on the two stepwise horizontal stages and neighboring parts of the MoSe$_2$ layer. The electrode layer is provided on the two barrier layers and a part of the MoSe$_2$ layer.

The substrate is a Si substrate. The InGaN layer has a thickness of 150 nm. The MoSe$_2$ layer has a thickness of 1.5 nm. An AlN layer, an AlGaN layer and a GaN layer respectively have a thickness of 350 nm, a thickness of 675 nm, and a thickness of 4.5 µm.

Figure 2:
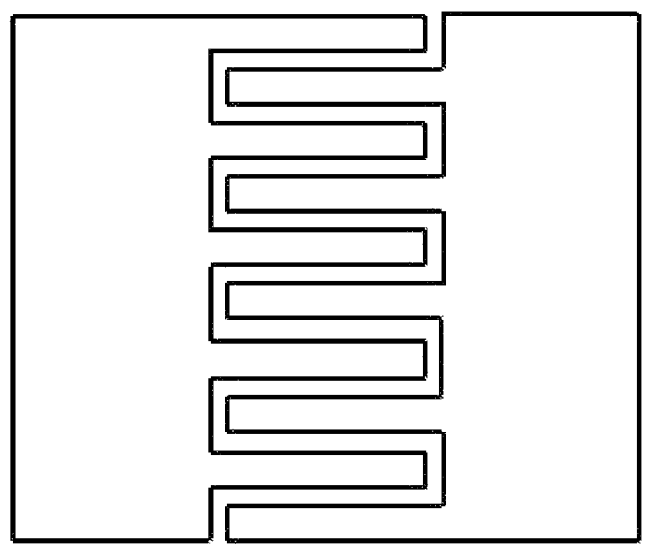
FIG. 2 is a schematic top view of an electrode structure of a MoSe$_2$/InGaN multispectral photoelectric detector according to the present disclosure.

As shown in FIG. 2, the electrode is shaped as an interdigital electrode. The electrode layer is a metal electrode layer, and is specifically a Ti/Au metal layer. The Ti/Au metal layer includes a Ti metal layer and an Au metal layer that are arranged from bottom to top. The Ti layer is adjacent to the barrier layer. The Ti metal layer has a thickness of 25 nm. The Au metal layer has a thickness of 105 nm.

A preparation method of the $MoSe_2$/InGaN multispectral photoelectric detector includes the following steps:

(1) The buffer layer is grown on the substrate by MOCVD, and the InGaN layer and the $MoSe_2$ layer are sequentially grown on the buffer layer by MOCVD.

(2) The $MoSe_2$ layer is etched, such that the $MoSe_2$ layer forms the stepwise horizontal stages on the InGaN layer. Photoetching (including surface spin-coating, drying, exposure, development and oxygen plasma treatment) is performed on the stepwise horizontal stages on the InGaN layer and the $MoSe_2$ layer to obtain regions for evaporating the barrier layer. The $Al_2O_3$ barrier layer is prepared by evaporation.

(3) Photoetching is performed on each of the $Al_2O_3$ barrier layer (surface spin-coating, drying, exposure, development and oxygen plasma treatment are performed on the $Al_2O_3$ barrier layer) to obtain a region for evaporating a metal electrode. The metal electrode evaporated on the $Al_2O_3$ barrier layer.

The buffer layer is prepared by sequentially and epitaxially growing the AlN layer, the AlGaN layer and the GaN layer on the substrate by the MOCVD from bottom to top at a temperature of 1150° C., a temperature of 1150° C. and a temperature of 1100° C. $N_2$ gas has a flow of 35 sccm.

The $MoSe_2$/InGaN layer is grown on the buffer layer by MOCVD at a temperature of 700° C.

Steps (2) and (3) are implemented under drying time of 45 s, exposure time of 8 s, development time of 45 s, and oxygen plasma treatment time of 2.5 min.

The $Al_2O_3$ barrier layer and the metal electrode layer each have an evaporation rate of 0.25 nm/min.

Figure 3:
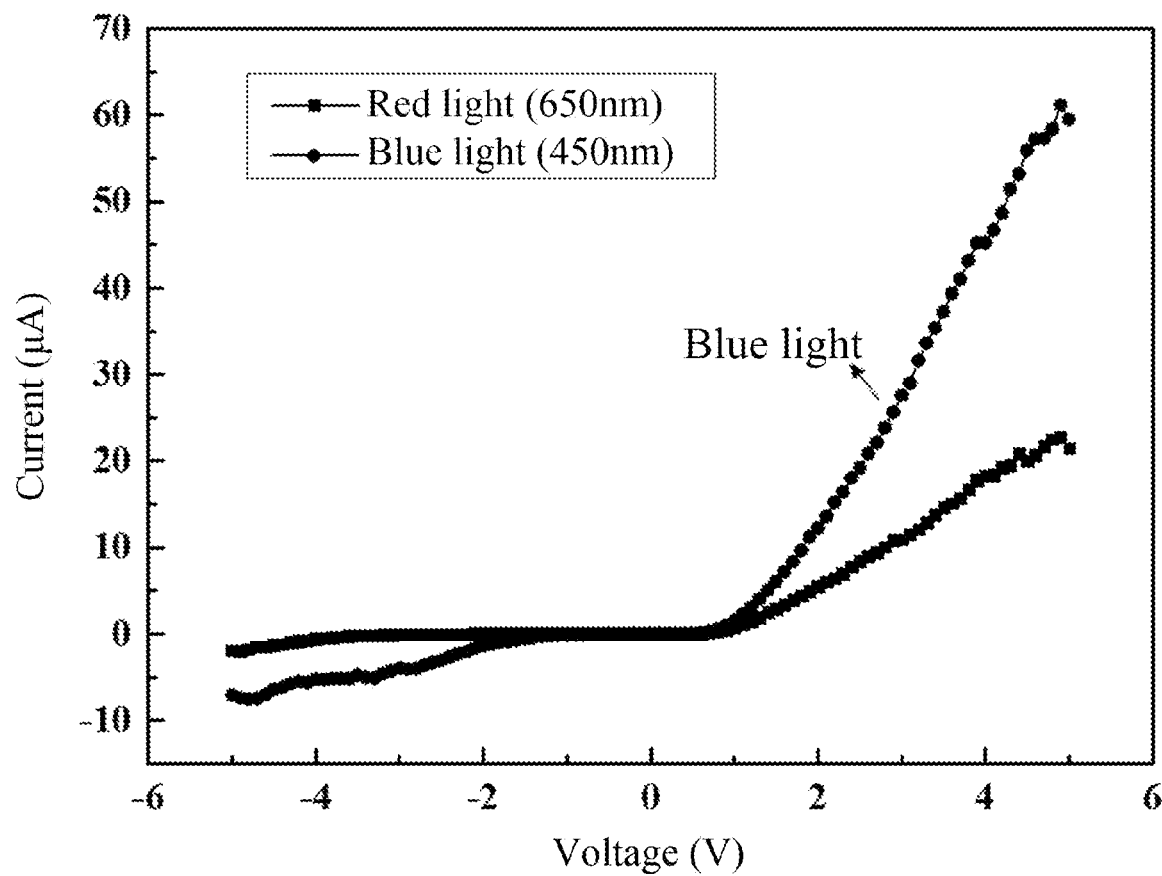
FIG. 3 is an I-V curve graph of a MoSe$_2$/InGaN multispectral photoelectric detector prepared in Embodiment 1.

FIG. 3 is an I-V curve graph of a $MoSe_2$/InGaN multispectral photoelectric detector prepared in the embodiment. As can be seen, the electrode is in Schottky contact. Under a bias voltage of 5 V, and irradiation of 650-nm red light, the photocurrent is 21 µA. Under irradiation of 450-nm blue light, the photocurrent is 50 µA. The detector has high-speed response in the blue band and the red band.

Embodiment 2

The embodiment provides a $MoSe_2$/InGaN multispectral photoelectric detector, including a substrate, a buffer layer, an InGaN layer and a $MoSe_2$ layer that are arranged sequentially from bottom to top. The $MoSe_2$ layer forms stepwise horizontal stages on the InGaN layer. The photoelectric detector further includes a barrier layer and an electrode layer. The barrier layer is provided on the stepwise horizontal stages on the InGaN layer and a part of the $MoSe_2$ layer. The electrode layer is provided on the barrier layer and covers a part of an exposed portion of the $MoSe_2$ layer.

The substrate is a Si substrate. The InGaN layer has a thickness of 100 nm. The $MoSe_2$ layer has a thickness of 1.0 nm. An AlN layer, an AlGaN layer and a GaN layer respectively have a thickness of 350 nm, a thickness of 650 nm, and a thickness of 4.0 µm.

As shown in FIG. 2, the electrode is shaped as an interdigital electrode. The electrode layer is a metal electrode layer, and is specifically a Ti/Au metal layer. The Ti/Au metal layer includes a Ti metal layer and an Au metal layer that are arranged from bottom to top. The Ti layer is adjacent to the barrier layer. The Ti metal layer has a thickness of 20 nm. The Au metal layer has a thickness of 100 nm.

A preparation method of the $MoSe_2$/InGaN multispectral photoelectric detector includes the following steps:

(1) The buffer layer is grown on the substrate by MOCVD, and the InGaN layer and the $MoSe_2$ layer are sequentially grown on the buffer layer by MOCVD.

(2) The $MoSe_2$ layer is etched, such that the $MoSe_2$ layer forms the stepwise horizontal stages on the InGaN layer. Photoetching (including surface spin-coating, drying, exposure, development and oxygen plasma treatment) is performed on the stepwise horizontal stages on the InGaN layer and the $MoSe_2$ layer to obtain regions for evaporating the barrier layer. The $Al_2O_3$ barrier layer is prepared by evaporation.

(3) Photoetching is performed on each of the $Al_2O_3$ barrier layer (surface spin-coating, drying, exposure, development and oxygen plasma treatment are performed on the $Al_2O_3$ barrier layer) to obtain a region for evaporating a metal electrode. The metal electrode is evaporated on the $Al_2O_3$ barrier layer.

The buffer layer is prepared by sequentially and epitaxially growing the AlN layer, the AlGaN layer and the GaN layer on the substrate by MOCVD from bottom to top at a temperature of 1,100° C., a temperature of 1,100° C. and a temperature of 1,050° C. $N_2$ gas has a flow of 30 sccm.

The InGaN layer and the $MoSe_2$ layer are grown on the buffer layer by MOCVD at a temperature of 650° C.

Steps (2) and (3) are implemented under drying time of 40 s, exposure time of 5 s, development time of 40 s, and oxygen plasma treatment time of 2.0 min.

The $Al_2O_3$ barrier layer and the metal electrode layer each have an evaporation rate of 0.23 nm/min.

The $MoSe_2$/InGaN multispectral photoelectric detector prepared in the embodiment is tested.

The $MoSe_2$/InGaN multispectral photoelectric detector prepared in the embodiment has similar related performance with Embodiment 1. For related performance parameters, refer to corresponding drawings in Embodiment 1.

Embodiment 3

The embodiment provides a $MoSe_2$/InGaN multispectral photoelectric detector, including a substrate, a buffer layer, an InGaN layer and a $MoSe_2$ layer that are arranged sequentially from bottom to top. The $MoSe_2$ layer forms stepwise horizontal stages on the InGaN layer. The photoelectric detector further includes a barrier layer and an electrode layer. The barrier layer is provided on the stepwise horizontal stages on the InGaN layer and a part of the $MoSe_2$ layer. The electrode layer is provided on the barrier layer and covers a part of an exposed portion of the $MoSe_2$ layer.

The substrate is a Si substrate. The InGaN layer has a thickness of 200 nm. The $MoSe_2$ layer has a thickness of 2.0 nm. An AlN layer, an AlGaN layer and a GaN layer respectively have a thickness of 450 nm, a thickness of 750 nm, and a thickness of 5.0 µm.

As shown in FIG. 2, the electrode is shaped as an interdigital electrode. The electrode layer is a metal electrode layer, and is specifically a Ti/Au metal layer. The Ti/Au metal layer includes a Ti metal layer and an Au metal layer that are arranged from bottom to top. The Ti layer is adjacent to the barrier layer. The Ti metal layer has a thickness of 20 nm. The Au metal layer has a thickness of 100 nm.

A preparation method of the MoSe$_2$/InGaN multispectral photoelectric detector includes the following steps:

(1) The buffer layer is grown on the substrate by MOCVD, and the InGaN layer and the MoSe$_2$ layer are sequentially grown on the buffer layer by MOCVD.

(2) The MoSe$_2$ layer is etched, such that the MoSe$_2$ layer forms the stepwise horizontal stages on the InGaN layer. Photoetching (including surface spin-coating, drying, exposure, development and oxygen plasma treatment) is performed on the stepwise horizontal stages on the InGaN layer and the MoSe$_2$ layer to obtain regions for evaporating the barrier layer. The Al$_2$O$_3$ barrier layer is prepared by evaporation.

(3) Photoetching is performed on each of the Al$_2$O$_3$ barrier layer (surface spin-coating, drying, exposure, development and oxygen plasma treatment are performed on the Al$_2$O$_3$ barrier layer) to obtain a region for evaporating a metal electrode. The metal electrode is evaporated on the Al$_2$O$_3$ barrier layer.

The buffer layer is prepared by sequentially and epitaxially growing the AlN layer, the AlGaN layer and the GaN layer on the substrate by MOCVD from bottom to top. The AlN layer, the AlGaN layer and the GaN layer are respectively grown at a temperature of 1,200° C., a temperature of 1,200° C. and a temperature of 1,150° C. N$_2$ gas has a flow of 40 sccm.

The InGaN layer and the MoSe$_2$ layer are grown on the buffer layer by MOCVD at a temperature of 750° C.

Steps (2) and (3) are implemented under drying time of 50 s, exposure time of 10 s, development time of 50 s, and oxygen plasma treatment time of 3.0 min.

The Al$_2$O$_3$ barrier layer and the metal electrode layer each have an evaporation rate of 0.28 nm/min.

The MoSe$_2$/InGaN multispectral photoelectric detector prepared in the embodiment is tested.

The MoSe$_2$/InGaN multispectral photoelectric detector prepared in the embodiment has similar related performance with Embodiment 1. For related performance parameters, refer to corresponding drawings in Embodiment 1.

The above embodiments are preferred implementations of the present disclosure, but the implementations of the present disclosure are not limited to these embodiments, and any other changes, modifications, substitutions, combinations and simplifications made without departing from the spirit and principle of the present disclosure shall be equivalent replacement means, and shall be included in the protection scope of the present disclosure.

What is claimed is:

1. A molybdenum diselenide (MoSe$_2$)/InGaN multispectral photoelectric detector, comprising a substrate, a buffer layer, an InGaN layer and a MoSe$_2$ layer, wherein the substrate, the buffer layer, the InGaN layer and the MoSe$_2$ layer are arranged sequentially from bottom to top, wherein the MoSe$_2$ layer partially covers the InGaN layer; and the photoelectric detector further comprises a barrier layer and an electrode layer; the barrier layer is provided on the InGaN layer not covered by the MoSe$_2$ layer and on a part of the MoSe$_2$ layer; and the electrode layer is provided on the barrier layer and covers a part of an exposed portion of the MoSe$_2$ layer.

2. The MoSe$_2$/InGaN multispectral photoelectric detector according to claim 1, wherein the buffer layer comprises an AlN layer, an AlGaN layer and a GaN layer, wherein the AlN layer, the AlGaN layer and the GaN layer are arranged sequentially from bottom to top; the AlN layer is provided on the substrate; and the InGaN layer is provided on the GaN layer; and the InGaN layer has a thickness of 100 nm to 200 nm, and the MoSe$_2$ layer has a thickness of 1 nm to 2 nm.

3. The MoSe$_2$/InGaN multispectral photoelectric detector according to claim 2, wherein the AlN layer, the AlGaN layer and the GaN layer respectively have a thickness of 350 nm to 450 nm, a thickness of 650 nm to 700 nm, and a thickness of 4 μm to 5 μm.

4. The MoSe$_2$/InGaN multispectral photoelectric detector according to claim 1, wherein the substrate is a Si substrate; and the barrier layer is an Al$_2$O$_3$ barrier layer.

5. The MoSe$_2$/InGaN multispectral photoelectric detector according to claim 1, wherein that the MoSe$_2$ layer partially covers the InGaN layer indicates the MoSe$_2$ layer forms stepwise horizontal stages on the InGaN layer; and two ends of the MoSe$_2$ layer respectively form the stepwise horizontal stages on the InGaN layer; and the electrode layer is shaped as an interdigital electrode; the electrode layer is a metal electrode layer, wherein the electrode layer is a Ti/Au metal layer; the Ti/Au metal layer comprises a Ti metal layer and an Au metal layer, wherein the Ti metal layer and the Au metal layer are arranged from bottom to top; and the Ti layer is adjacent to the barrier layer.

6. The MoSe$_2$/InGaN multispectral photoelectric detector according to claim 5, wherein the Ti metal layer has a thickness of 20 nm to 30 nm, and the Au metal layer has a thickness of 100 nm to 110 nm.

7. A preparation method of the MoSe$_2$/InGaN multispectral photoelectric detector according to claim 1, comprising the following steps:

(1) growing the buffer layer on the substrate by metal organic chemical vapor deposition (MOCVD), and sequentially growing the InGaN layer and the MoSe$_2$ layer on the buffer layer by MOCVD;

(2) etching the MoSe$_2$ layer, such that the MoSe$_2$ layer forms stepwise horizontal stages on the InGaN layer; performing photoetching on the stepwise horizontal stages on the InGaN layer and the MoSe$_2$ layer to obtain regions for evaporating the barrier layer; and preparing the barrier layer by evaporation; and (3) performing photoetching on each of the barrier layer and the MoSe$_2$ layer not covered by the barrier layer to obtain a region for evaporating a metal electrode; and evaporating the metal electrode on the barrier layer.

8. The preparation method according to 7, wherein the buffer layer is prepared by sequentially and epitaxially growing an AlN layer, an AlGaN layer and a GaN layer on the substrate by MOCVD from bottom to top; and the AlN layer, the AlGaN layer and the GaN layer are respectively grown at a temperature of 1,100° C. to 1,200° C., a temperature of 1,100° C. to 1,200° C. and a temperature of 1,000° C. to 1,150° C.; and the InGaN layer and the MoSe$_2$ layer are grown on the buffer layer by MOCVD at a temperature of 600° C. to 750° C.

9. The preparation method according to 7, wherein the barrier layer and a metal electrode layer each have an evaporation rate of 0.23 nm/min to 0.28 nm/min.

10. The preparation method according to claim 7, wherein in the MoSe$_2$/InGaN multispectral photoelectric detector, the buffer layer comprises an AlN layer, an AlGaN layer and a GaN layer, wherein the AlN layer, the AlGaN layer and the GaN layer are arranged sequentially from bottom to top; the AlN layer is provided on the substrate; and the InGaN layer is provided on the GaN layer; and the InGaN layer has a thickness of 100 nm to 200 nm, and the $MoSe_2$ layer has a thickness of 1 nm to 2 nm.

11. The preparation method according to claim 10, wherein in the $MoSe_2$/InGaN multispectral photoelectric detector, the AlN layer, the AlGaN layer and the GaN layer respectively have a thickness of 350 nm to 450 nm, a thickness of 650 nm to 700 nm, and a thickness of 4 μm to 5 μm.

12. The preparation method according to claim 7, wherein in the $MoSe_2$/InGaN multispectral photoelectric detector, the substrate is a Si substrate; and the barrier layer is an $Al_2O_3$ barrier layer.

13. The preparation method according to claim 7, wherein in the $MoSe_2$/InGaN multispectral photoelectric detector, that the $MoSe_2$ layer partially covers the InGaN layer indicates the $MoSe_2$ layer forms the stepwise horizontal stages on the InGaN layer; and two ends of the $MoSe_2$ layer respectively form the stepwise horizontal stages on the InGaN layer; and the electrode layer is shaped as an interdigital electrode; the electrode layer is a metal electrode layer, wherein the electrode layer is a Ti/Au metal layer; the Ti/Au metal layer comprises a Ti metal layer and an Au metal layer, wherein the Ti metal layer and the Au metal layer are arranged from bottom to top; and the Ti layer is adjacent to the barrier layer.

14. The preparation method according to claim 13, wherein in the $MoSe_2$/InGaN multispectral photoelectric detector, the Ti metal layer has a thickness of 20 nm to 30 nm, and the Au metal layer has a thickness of 100 nm to 110 nm.

15. A method of using the $MoSe_2$/InGaN multispectral photoelectric detector according to claim 1, comprising: using the $MoSe_2$/InGaN multispectral photoelectric detector in blue and/or red multispectral photoelectric detection.

16. The method according to claim 15, wherein in the $MoSe_2$/InGaN multispectral photoelectric detector, the buffer layer comprises an AlN layer, an AlGaN layer and a GaN layer, wherein the AlN layer, the AlGaN layer and the GaN layer are arranged sequentially from bottom to top; the AlN layer is provided on the substrate; and the InGaN layer is provided on the GaN layer; and the InGaN layer has a thickness of 100 nm to 200 nm, and the $MoSe_2$ layer has a thickness of 1 nm to 2 nm.

17. The method according to claim 16, wherein in the $MoSe_2$/InGaN multispectral photoelectric detector, the AlN layer, the AlGaN layer and the GaN layer respectively have a thickness of 350 nm to 450 nm, a thickness of 650 nm to 700 nm, and a thickness of 4 μm to 5 μm.

18. The method according to claim 15, wherein in the $MoSe_2$/InGaN multispectral photoelectric detector, the substrate is a Si substrate; and the barrier layer is an $Al_2O_3$ barrier layer.

19. The method according to claim 15, wherein in the $MoSe_2$/InGaN multispectral photoelectric detector, that the $MoSe_2$ layer partially covers the InGaN layer indicates the $MoSe_2$ layer forms the stepwise horizontal stages on the InGaN layer; and two ends of the $MoSe_2$ layer respectively form the stepwise horizontal stages on the InGaN layer; and the electrode layer is shaped as an interdigital electrode; the electrode layer is a metal electrode layer, wherein the electrode layer is a Ti/Au metal layer; the Ti/Au metal layer comprises a Ti metal layer and an Au metal layer, wherein the Ti metal layer and the Au metal layer are arranged from bottom to top; and the Ti layer is adjacent to the barrier layer.

20. The method according to claim 19, wherein in the $MoSe_2$/InGaN multispectral photoelectric detector, the Ti metal layer has a thickness of 20 nm to 30 nm, and the Au metal layer has a thickness of 100 nm to 110 nm.

* * * * *